(12) United States Patent
Bouchut

(10) Patent No.: US 7,923,317 B2
(45) Date of Patent: Apr. 12, 2011

(54) CRYSTALLIZATION METHOD

(75) Inventor: Philippe Bouchut, Voreppe (FR)

(73) Assignee: Commissariat a l'Energie Atomique, Paris (FR)

( * ) Notice: Subject to any disclaimer, the term of this patent is extended or adjusted under 35 U.S.C. 154(b) by 279 days.

(21) Appl. No.: 12/292,882

(22) Filed: Nov. 28, 2008

(65) Prior Publication Data
US 2010/0075487 A1 Mar. 25, 2010

(30) Foreign Application Priority Data
Nov. 28, 2007 (WO) ............... PCT/FR2007/001965

(51) Int. Cl.
*H01L 21/00* (2006.01)
(52) U.S. Cl. ......... 438/166; 438/482; 438/486; 257/66; 257/70; 257/E21.133; 257/E21.324
(58) Field of Classification Search .............. 438/166, 438/482, 486, 487; 257/66, 70, 75, E21.324, 257/E21.133
See application file for complete search history.

(56) References Cited

U.S. PATENT DOCUMENTS

| | | | |
|---|---|---|---|
| 5,994,164 A | 11/1999 | Fonash et al. | |
| 6,278,130 B1 | 8/2001 | Joo et al. | |
| 6,965,122 B2 * | 11/2005 | Suzuki et al. | ............... 257/72 |
| 7,192,818 B1 | 3/2007 | Lee et al. | |
| 7,297,982 B2 * | 11/2007 | Suzuki et al. | ............... 257/72 |
| 2004/0137671 A1 | 7/2004 | Kim | |
| 2004/0142543 A1 | 7/2004 | Fukunaga et al. | |
| 2005/0142708 A1 | 6/2005 | Son et al. | |
| 2006/0267073 A1 | 11/2006 | Kato et al. | |

FOREIGN PATENT DOCUMENTS

JP    A-61-068385    4/1986

OTHER PUBLICATIONS

Gerbi et al., "Deposition of microcrystalline silicon: Direct evidence for hydrogen-induced surface mobility of Si adspecies", Journal of Applied Physics, Jan. 2001, vol. 89, No. 2, pp. 1463-1469.
Hu et al., "Growth Mechanism of Laser Annealing of Nickel-Induced Lateral Crystallized Silicon Films", Japanese Journal of Applied Physics, vol. 45, No. 1A, 2006, pp. 21-27.

* cited by examiner

*Primary Examiner* — Hsien-ming Lee
(74) *Attorney, Agent, or Firm* — Oliff & Berridge, PLC

(57) ABSTRACT

To crystallize a material, a thin layer of amorphous or polycrystalline material is deposited on at least one area of the surface of a top part of a substrate. A metal layer is then deposited on at least one area of the thin layer. Thermal treatment is then performed to enable crystalline growth of the material of the thin layer, resulting in:
  a rapid temperature increase of the top part of the substrate until liquid or overmelted liquid state is achieved,
  and heat transfer from the interface between the top part of the substrate and the thin layer to the interface between the thin layer and the metal layer.

13 Claims, 5 Drawing Sheets

CRYSTALLIZATION METHOD

BACKGROUND OF THE INVENTION

The invention relates to a crystallization method.

STATE OF THE ART

A large number of crystallization methods exist—crystallization of a material from its vapor phase, crystallization from molten baths or crystallization from solutions. In these cases, the crystal appears by cooling when the liquid-solid transition or the vapor-solid transition takes place.

More particularly, crystallized materials in monocrystalline form can be obtained by growth from a monocrystalline seed. For example, monocrystalline silicon ingots can be obtained by the Czochralski method which consists in soaking a monocrystalline seed, at the surface of a weakly superheated silicon bath, and in drawing the seed at continuous speed. Solidification takes place and reproduces the crystalline lattice of the seed until a monocrystalline silicon ingot is obtained. The silicon bath is contained in a crucible that must be formed by a material having a higher melting point than that of monocrystalline silicon. It is for example made from silica or from boron nitride. However, the higher the melting temperature of the monocrystal, the larger the crystal volume, and the more prohibitive the cost of the crucible becomes. In addition, the liquid bath has to be kept at melting temperature throughout growth of the crystal, which requires a large energy input and control over long periods of time. Finally, current crystallization methods are not suitable for producing crystals on large surfaces.

Furthermore, in the case of a monocrystalline silicon ingot obtained by the Czochralski method, the ingot has to be subjected to a certain number of additional steps before being able to be used in wafer form. It thus has to be conditioned, cut, polished, cleaned, and so forth. These treatments do however result in loss of matter and affect the physical properties of the surface of the monocrystalline silicon. Thus, in the microelectronics field, on completion of conditioning, the monocrystalline silicon wafers have a thickness of more than 100 μm to enable them to be picked up and handled in robotized manner. The thickness used to produce a microelectronics device does however only represent a very small proportion of the total wafer thickness. Monocrystalline crystallization methods of this kind are therefore not suitable for achieving nanometric thicknesses.

Polycrystalline thin films can be obtained by crystallization, either from liquid phase or from solid phase of an amorphous layer.

For example, crystallization, in polycrystalline form, of an amorphous silicon layer deposited on a substrate, for example a glass substrate, can be performed using a pulsed laser beam, mainly an excimer laser. In this case, crystallization is achieved after a passage in liquid phase, i.e. via liquid means. The laser energy is in fact absorbed locally by the layer to be crystallized, which enables the material to be heated to high temperature, whereas the substrate remains at a relatively low temperature. The polycrystal then appears in the melting-solidification cycle. When growth called SLG (standing for Super Lateral Growth) takes place, crystallization of the area exposed and heated by the laser begins on the external parts of said area, said parts being those that cool most quickly within the area heated by the laser beam.

The maximum dimension of the grains obtained by this liquid phase crystallization technique is about 5 to 10 times the thickness of the layer to be crystallized. But the layers in general have a thickness of a few hundred nanometers. This technique therefore in general applies to very thin layers. Furthermore, it is a technique that is difficult to implement to homogeneously crystallize a large surface.

To remedy this drawback, Patent Application JP-A-61 068385 for example proposes depositing a thin layer of silicon to be crystallized on an intermediate layer of structured silica. In Patent Application US-A-2005142708, it has been proposed to use a metal layer arranged under the intermediate silica layer to reflect the laser beam light to obtain more homogeneous grains in the thickness of the layer to be crystallized. However, to date, liquid phase crystallization using a laser only produces polycrystals with a grain size that is at best about one micrometer for layers having a thickness of less than 100 nm.

Another technique consists in crystallizing the material in solid phase, i.e. without passing via liquid state. Solid phase crystallization, also called SPC, is generally achieved by conventional thermal annealing. The stack formed by an amorphous layer deposited on a substrate is thus subjected to annealing performed for a period ranging from several minutes to a few hours, depending on the temperature and the type of material to be crystallized. The material to be crystallized and the substrate are moreover heated to the same temperature, which is traditionally kept below the glass transition or melting temperature of the substrate.

Solid phase crystallization can also be enhanced by deposition of materials facilitating germination of crystallites. Such a technique, called metal induced crystallization or MIC, is described in U.S. Pat. No. 5,994,164 to perform controlled adjustment of the grain size of a thin layer of amorphous silicon crystallized in solid phase. Thus, a catalysing element such as palladium or nickel is arranged on the layer to be crystallized to control the grain size of said layer, before heat treatment is performed in a conventional furnace, for example at about 600° C. for 10 minutes or less.

U.S. Pat. No. 5,994,164 also makes mention of an alternative solution for controlling the grain size. This alternative solution consists in performing rapid thermal annealing, also referred to as RTA. This enables the crystallization time of the layers on the substrate to be considerably reduced. The RTA technique does however result in much less defective but smaller grains than conventional thermal annealing, on account of the large number of seeds created.

However, the glass substrate used in U.S. Pat. No. 5,994,164 according to the MIC technique or according to the RTA technique is slightly deformed. U.S. Pat. No. 5,994,164 then recommends another solution consisting in depositing an intermediate layer, between the substrate and the layer to be crystallized, this intermediate layer having a lower glass transition temperature than the solid phase crystallization temperature of the layer to be crystallized to enable relaxation of the strain induced by crystallization of said layer and prevent deformation of the substrate.

Methods for depositing materials on a substrate also exist, by reactive magnetron sputtering or by plasma enhanced chemical vapor deposition (PECVD), enabling partial crystallization of the material on the substrate. However, with these deposition techniques, the grain size obtained is smaller than a micrometer, which does not always give the material optimal thermal, optical and electronic properties for the required applications. For example, in the article "Deposition of microcrystalline silicon: Direct evidence for hydrogen-induced surface mobility of Si adspecies" (Journal of Applied Physics, January 2001, Vol 89, N°2, pp. 1463-1469) J. E. Gerbi et al. study deposition by reactive magnetron sputtering of hydrogenated microcrystalline silicon films on a chromium film thermally evaporated on a non-heated glass substrate. Formation of microcrystalline silicon films is achieved for high partial hydrogen pressures and for a substrate temperature comprised between 150° C. and 300° C.

OBJECT OF THE INVENTION

The object of the invention is to provide a crystallization method remedying the shortcomings of the methods according to the prior art. A particular object of the invention is to obtain a crystallized material of small thickness, for example about a hundred nanometers, and of very large surface, with homogeneous properties over the whole of said surface.

According to the invention, this object is achieved by the appended claims.

More particularly, this object is achieved by a solid phase crystallization method comprising the following successive steps:
 a) deposition of at least one thin layer of amorphous or polycrystalline material on at least one area of the surface of a top part of a substrate,
 b) deposition of at least one metal layer with a thickness comprised between 1 nm and 20 nm, advantageously between 5 nm and 10 nm, on an area of said thin layer, the top part of the substrate being formed, after step b), by an amorphous material able to change to a liquid or overmelted liquid state,
 c) and thermal treatment to enable crystalline growth of the material of the thin layer, simultaneously causing:
  a temperature increase of the top part of the substrate at a rate of more than 100K per second until the material of the top part of the substrate goes to liquid or overmelted liquid state,
  and a heat transfer from the interface between the top part of the substrate and the thin layer to the interface between the thin layer and the metal layer.

According to a development of the invention, step c) is performed by application of a continuous or pulsed laser beam presenting an emission wavelength range corresponding to the absorption wavelength range of the top part of the substrate and to the transparency wavelength range of the amorphous or polycrystalline material of the thin layer to be crystallized.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Figure 1:
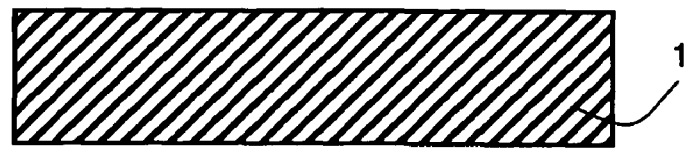
FIGS. 1 to 7 schematically represent cross-section views of different steps of a first embodiment of a method according to the invention.

Crystallization method comprises a deposition step of at least one thin layer, made of amorphous or polycrystalline material designed to be crystallized for example in monocrystalline form, on at least one area of the surface of a top part of a substrate. The thin layer deposition step is followed by a deposition step of at least one metal layer on an area of said thin layer of amorphous or polycrystalline material. The metal layer has a thickness comprised between 1 nm and 20 nm, advantageously between 5 nm and 10 nm. A heat treatment step is then performed. Under certain conditions, a reducing, inert or oxidative atmosphere can be provided for the heat treatment.

Furthermore, the top part of the substrate is formed by a different material from the material to be crystallized. The material of the top part of the substrate is moreover amorphous before the heat treatment and is able to change to liquid or overmelted liquid state.

The top part of the substrate is for example formed before the heat treatment step by an amorphous material such as:
 a glass, for example oxide-based (silicon oxide ($SiO_2$), borosilicate-based ($B_2O_3$, $SiO_2$),) and chalcogenide-based glasses (such as $As_2Se_3$) or ceramics such as alumina ($Al_2O_3$), etc.
 or a non-crystalline polymer such as polycarbonate.

In this case, said amorphous material can be subjected to a glass transition phenomenon.

In the case of a glass, study of the variation of a thermodynamic quantity, such as the volume specific heat, enables the observation to be made that, when cooling from stable liquid phase takes place, if the viscosity is too high or if cooling is too rapid, crystallization does not have time to take place and an overmelted liquid is obtained. The temperature zone in which the overmelted liquid is obtained corresponds to the glass transition zone. Furthermore, if cooling is continued, the viscosity of the liquid increases greatly and the overmelted liquid becomes almost solid. When the viscosity reaches $10^{13}$ poises however, the rigidity prevents local microscopic movements and a change of slope of the studied quantity is observed. The temperature at which this change occurs corresponds to the glass transition temperature of the material (Tg). Thus, for a temperature lower than the glass transition temperature, the material is said to be solid with the structural disorder of a liquid, whereas above the melting temperature, the material is said to be in liquid state. What is meant by glass transition zone is a temperature range bounded by the melting temperature and by the glass transition temperature of said material. This glass transition zone corresponds to the change from solid state to liquid state of the material. In this temperature zone called transition zone or glass transition zone, the material is considered to be in overmelted liquid state.

Rather than being made of glass or non-crystalline polymer, the top part of the substrate can also be formed by a metal (for example Fe, Cu, Ti, etc.) or a metal alloy (for example stainless steel) that is amorphous before the heat treatment step. In this case, the transition zone corresponds to the melting temperature of the material constituting the top part of the substrate.

The material constituting the top part of the substrate can furthermore be the same material as that constituting the thin layer to be crystallized, the two materials then preferably presenting different structural states. For example the material constituting the top part of the substrate can be in amorphous form, whereas that constituting the thin layer to be crystallized can be in polycrystalline form. However, the material of the top part of the substrate is advantageously different from the amorphous or polycrystalline material to be crystallized.

Thus, in the crystallization method according to the invention, the heat treatment step is designed to bring about a very rapid increase of the temperature of the top part of the substrate, advantageously without directly heating the thin layer to be crystallized. The temperature increase, also called heat ramp, takes place at a rate of more than 100K per second and is performed until the top part of the substrate reaches the transition zone. The temperature increase is thus performed until the top part of the substrate changes to a liquid state or an overmelted liquid state.

Heat treatment is advantageously performed using a polarized laser beam, the energy of which is absorbed by the top part of the substrate. On the other hand, unlike a liquid phase crystallization method, within the scope of the invention, the laser beam does not heat the thin layer to be crystallized directly, but the top part of the substrate. The thin layer to be crystallized therefore does not go to a liquid state, but remains in a solid state. Thus, although advantageously using a laser beam, the crystallization method is a solid phase crystallization method.

The heat input of the laser beam is in fact sufficient for the top part of the substrate to go from solid state to liquid or overmelted liquid state. The thin layer to be crystallized on the other hand advantageously remains "cold" so that the heat flux is initially as intense as possible between the top part of the substrate and the thin layer to be crystallized. In other words, the thin layer to be crystallized hardly absorbs the energy emitted by the laser beam.

To obtain a rapid temperature increase of the top part of the substrate without heating the thin layer to be crystallized directly, the laser beam used in the heat treatment step advantageously presents a range of emission wavelengths corresponding:
  to the range of absorption wavelengths of the top part of the substrate,
  and to the range of transparency wavelengths of the amorphous or polycrystalline material to be crystallized.

Furthermore, the laser beam can also be continuous or pulsed and it can be a $CO_2$ or YAG laser.

Furthermore, the heat treatment step must simultaneously make the top part of the substrate go to liquid or overmelted liquid phase, and cause a heat transfer through the thin layer to be crystallized from the interface of said layer with the substrate to the interface of said layer and of the metal layer.

To obtain an intense a heat flux as possible, the absorption coefficient of the top part of the substrate is however advantageously three times higher than that of the thin layer to be crystallized in the emission wavelength range of the laser beam.

It has in fact surprisingly been found that the thermal transfer of the heat from the top part of the substrate through the thin layer to be crystallized causes straining of the thin layer to be crystallized. This straining is all the more intense the more rapid the thermal ramp and the greater the instantaneous temperature difference between the substrate and layer. Furthermore, this redistribution of the initial strain thermodynamically enhances crystallization, as there is then a reduction of the molar volume of the thin layer to be crystallized, which tends towards that of the crystalline phase.

The heat flux has to be maintained so that crystalline growth "in solid state" can continue. For this, the heat from the top part of the substrate and the crystallization enthalpy have to be able to be removed from the surface of the thin layer that is crystallizing. This heat removal is performed in radiative manner by the metal layer.

When the temperature decreases, the overmelted area of the substrate adapts to the densification of the crystallized layer before going to solid state.

Figure 2:
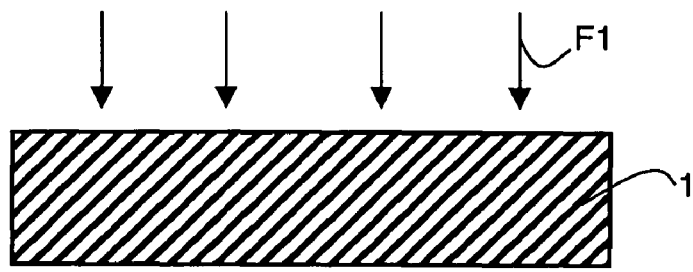
Figure 3:
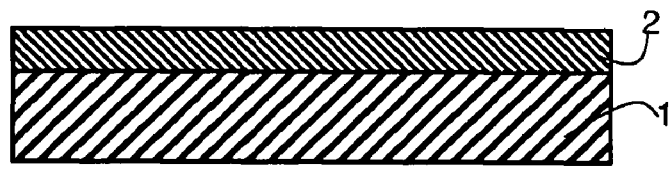

According to a first embodiment represented in FIGS. 1 to 7, crystallization of a material is obtained from a substrate 1 formed for example by a crystalline material which, made amorphous, presents a glass transition phenomenon. Substrate 1 is in particular treated to form an amorphous top part 2 in substrate 1. Arrows F1, in FIG. 2, represent the treatment step whereby top part 2 of substrate 1 is made amorphous. For example, top part 2 of substrate 1 can be made amorphous by polishing or by ion implantation.

Figure 4:
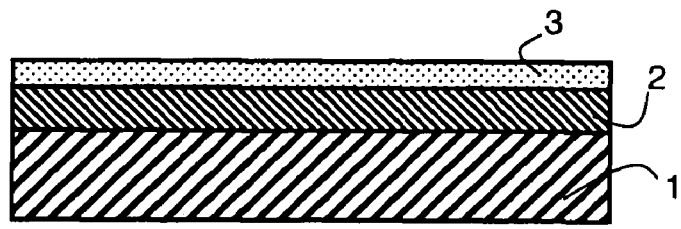

As illustrated in FIG. 4, a thin layer 3 formed by a material to be crystallized is then deposited on the free surface of top part 2 of substrate 1. The free surface of the top part of the substrate can be previously cleaned before thin layer 3 is deposited. In addition, in FIG. 4, thin layer 3 is deposited on the whole of the free surface of top part 2 of substrate 1.

The material to be crystallized is more particularly deposited in amorphous or polycrystalline form. It can be of any type provided that it is able to be crystallized in solid phase. For example, it is a semi-conducting material such as silicon, germanium, gallium arsenide (AsGa), gallium and indium arsenide (InGaAs), or indium antimonide (InSb). It can also be an insulating material such as an oxide, for example silicon oxide ($SiO_2$), boron oxide ($B_2O_3$), titanium oxide ($TiO_2$), or tantalum oxide ($Ta_2O_5$), or it can be arsenic selenide ($As_2Se_3$).

Deposition of thin layer 3 can moreover be realized by of any known type. Thin layer 3 can for example be deposited by evaporation, or by sputtering either assisted by ion gun or by magnetron or not.

Figure 5:
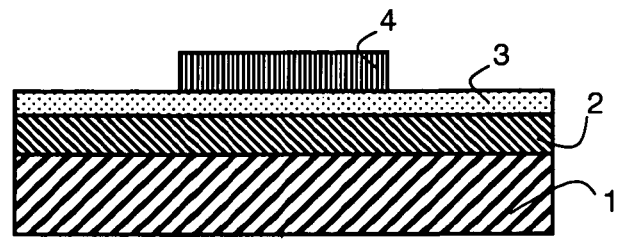

Then, as represented in FIG. 5, a metal layer 4 is deposited on an area of the free surface of thin layer 3. The thickness of said metal layer 4 is comprised between 1 nm and 20 nm, advantageously between 5 nm and 10 nm. When the thickness of the metal layer is very small, for example about 1 nm, it is not possible to have a metal layer other than in the form of a plurality of aggregates.

Metal layer 4 is in particular formed by a metal such as a metal used in catalysis (Ni, Pd, Pt), but not only. It can also be chosen from Cu, Ag, Cr, Au, Fe, etc. Furthermore, metal layer 4 can be formed by a pure metal, a metal alloy or a mixture of metals (Ni+Cr, Ni+Au, etc.). In a privileged embodiment, metal layer 4 is not continuous and is formed by aggregates of the metal. In all the embodiments, metal layer 4 can be arranged on the whole surface of the substrate or only on areas where crystallization is sought for. The thickness of the metal layer formed by aggregates has a thickness that is equivalent in mass to that of a continuous layer comprised between 1 and 20 nm, advantageously between 3 and 10 nm.

Furthermore, unlike the teaching of document U.S. Pat. No. 5,994,164, within the scope of the invention, metal layer 4 is not designed to act as catalyst to perform controlled adjustment of the grain size. It is the association of said metal layer, preferably in the form of aggregates, with a particular heat treatment enabling the top part of the substrate to go to liquid or overmelted liquid state, advantageously without directly heating the thin layer to be crystallized, which enables solid phase crystallization to be obtained according to the invention. More particularly, metal layer 4 acts as heat sink to remove the heat located in the thin layer to be crystallized, i.e. it serves the purpose of removing the heat originating from the thin layer to be crystallized, in radiative manner. Without this metal layer, the layer to be crystallized goes to liquid state and the method is no longer a "solid phase" method. In the privileged case where the metal layer is formed by aggregates, radiative heat emission is performed by the metal aggregates in interaction with the layer to be crystallized.

Figure 6:
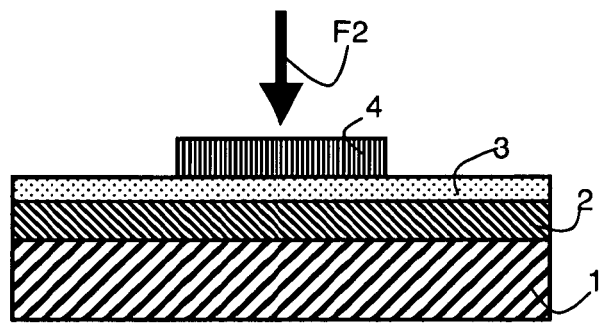
Figure 7:
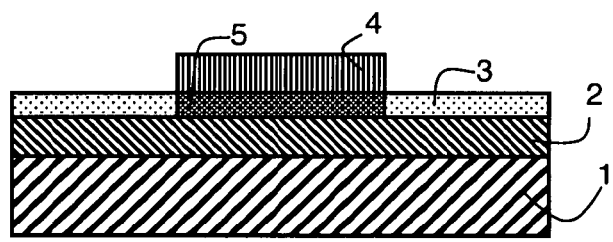

Then, as represented in FIGS. 6 and 7, once thin layer 3 and metal layer 4 have been deposited, the assembly formed by substrate 1, thin layer 3 and metal layer 4 is subjected to heat treatment. The heat treatment is designed to provide heat to top part 2 of substrate 1 and to cause a rapid temperature increase in top part 2 of substrate 1 and more generally in substrate 1. The temperature of top part 2 of substrate 1 therefore increases, at least up to the glass transition zone, so that said top part 2 goes at least to the overmelted liquid state. The temperature increase of top part 2 of substrate must be rapid, with a rate of more than 100K/s.

Such a temperature increase can be obtained by making for example a continuous or pulsed laser beam interact on top part 2 of substrate 1 through metal layer 4 and thin layer 3. In this case, the range of emission wavelengths of the laser beam corresponds to the range of absorption wavelengths of top part 2 of substrate 1. The laser beam emission is thereby partially or totally absorbed by top part 2 of substrate 1. The laser beam emission wavelength range on the other hand also corresponds to the transparency wavelength range of thin layer 3. As thin layer 3 does not absorb or hardly absorbs the laser beam wavelengths, it is not directly heated. In FIG. 5, the laser beam is represented by arrow F2 and it is applied such as to pass through metal layer 4 and thin layer 3 before reaching top part 2 of substrate 1.

For example, for a top part 2 made from silica and a thin layer 3 to be crystallized made from germanium, the laser beam can be a $CO_2$ laser emitting at 10.6 µm. According to another example, for a metal top part 2 and a thin layer 3 to be crystallized made from silicon, the laser beam can be a $CO_2$ laser or a YAG laser emitting at 1.064 µm. At this wavelength, amorphous silicon absorbs little (a few hundred $cm^{-1}$) compared with metal.

Thus, during heat treatment, top part 2 of the substrate goes from solid state to an overmelted liquid state and enables crystallization of an area 5 of thin layer 3 by heat transfer. Area 5 corresponds to the area of thin layer 3 arranged under metal layer 4, whereas the rest of thin layer 3, not covered by the metal thin layer, is not crystallized (FIG. 7). Furthermore, if metal layer 4 covers the whole of thin layer 3 to be crystallized, the latter can be totally crystallized.

Figure 8:
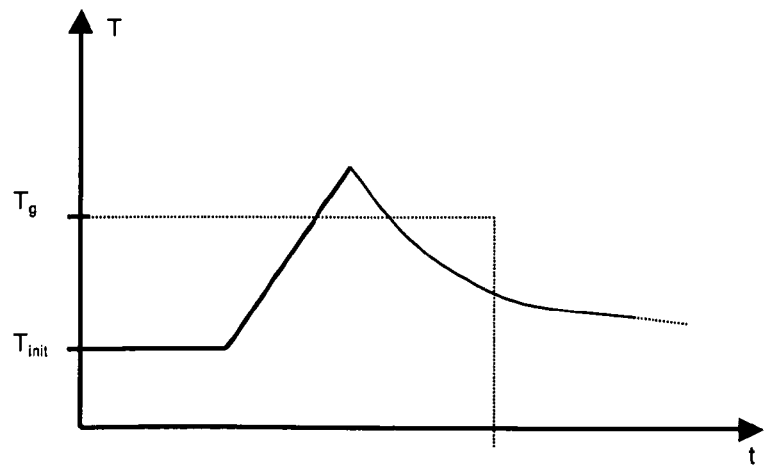
FIG. 8 represents the temperature cycle applied to the top part of the substrate versus time, during said first embodiment.
Figure 9:
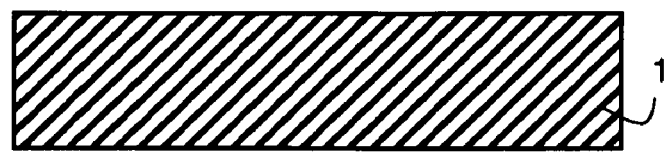
FIGS. 9 to 12 schematically represent cross-section views of an alternative embodiment of said first embodiment.
Figure 10:
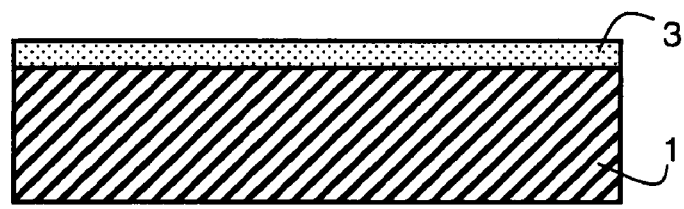
Figure 11:
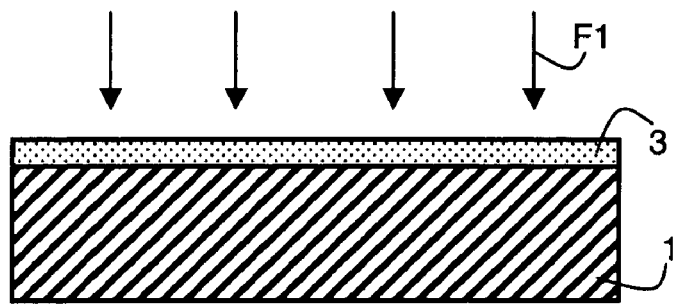
Figure 12:
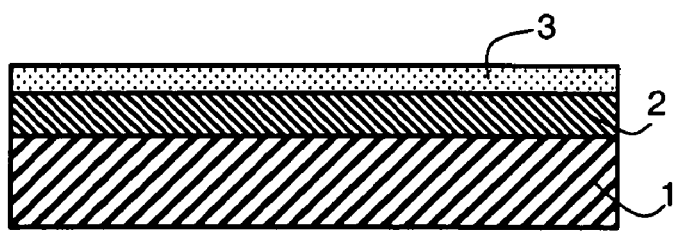
Figure 13:
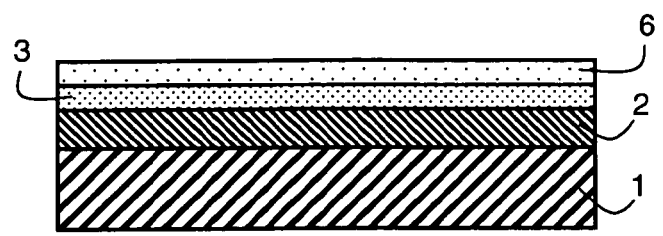
FIGS. 13 to 16 schematically represent cross-section views of different steps of a third embodiment of a method according to the invention.
Figure 14:
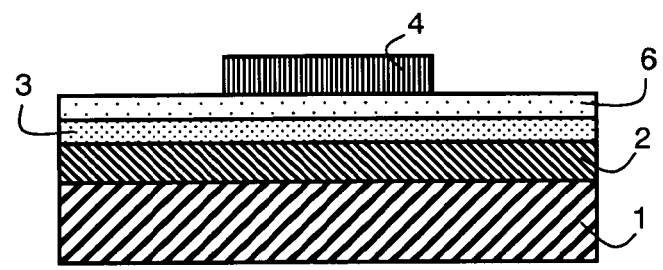
Figure 15:
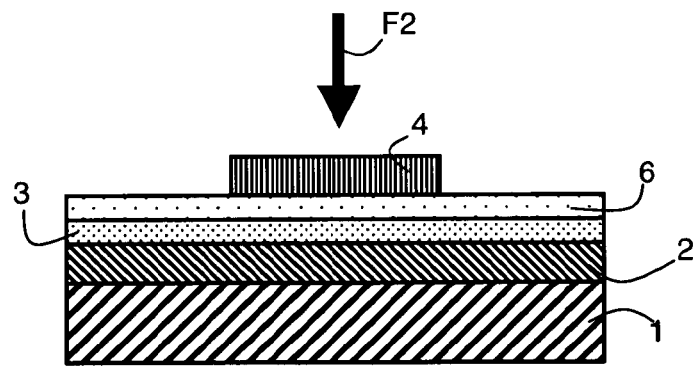
Figure 16:
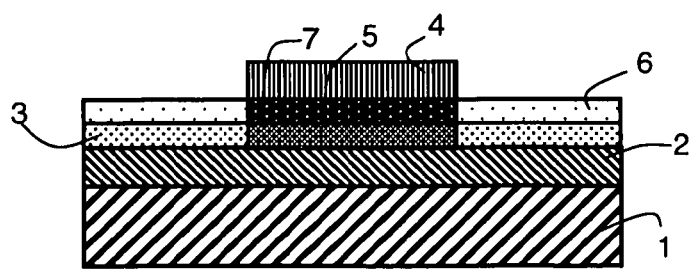
Figure 17:
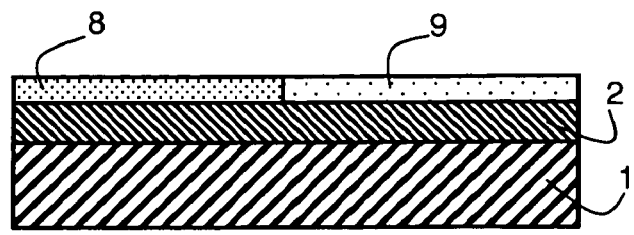
FIGS. 17 to 20 schematically represent cross-section views of different steps of a fourth embodiment of a method according to the invention.

For example purposes, FIG. 8 represents the temperature cycle applied to top part 2 of substrate 1 versus time, in the embodiment represented in FIGS. 1 to 7. The temperature of top part 2 of substrate 1 remains for example constant during deposition of thin layer 3, and then increases rapidly during the heat treatment step. The temperature increase of top part 2 of substrate 1 is for example linear and goes beyond the glass transition temperature of the material of top part 2 of substrate 1.

Top part 2 of substrate 1 can be made from any type of solid material, either amorphous or able to become amorphous by treatment, provided that the material is able to go to liquid or overmelted liquid state. Thus, top part 2 of substrate 1 or even the whole of substrate 1 can be amorphous before the crystallization method. The substrate or at least a top part of the substrate can for example be formed by a glass such as an amorphous oxide, an amorphous semi-conducting material or element, or by a non-crystalline polymer. As illustrated by the embodiment represented by FIGS. 1 to 7, the top part of the substrate or even the whole of the substrate can also be in crystalline form at the beginning of the method. In this case, before the heat treatment is applied, it can be subjected to treatment enabling at least a top part to be obtained in amorphous form. The top part of the substrate or the whole of the substrate can thereby be made amorphous before deposition of thin layer to be crystallized 3, before or after deposition of metal layer 4.

Thus, as illustrated in an alternative embodiment represented in FIGS. 9 to 12, substrate 1 can remain crystalline during deposition of thin layer 3. Treatment, illustrated by arrows F1 in FIG. 11, can then be performed after deposition of thin layer 3 and before the heat treatment. This treatment enables an amorphous top part 2 to be obtained. Finally, even if substrate 1 or at least a top part 2 of substrate 1 is in amorphous form before deposition of thin layer 3, the substrate or said top part 2 of substrate 1 can undergo suitable treatment to reinforce the strained surface state, before the heat treatment. Such a treatment can be performed before deposition or after deposition of thin layer 3. The treatment can for example be:
  mechanical treatment such as polishing, or sanding,
  heat treatment such as melting followed by hardening,
  physical-chemical treatment such as vapor deposition or ion implantation.

In another embodiment illustrated in FIGS. 13 to 16, several thin layers respectively formed by different materials to be crystallized, for example in monocrystalline form, are successively deposited on the surface of top part 2 of substrate 1. For example, in FIG. 13, an additional thin layer 6 is deposited on thin layer 3 to be crystallized so as to obtain two superposed thin layers. A metal layer 4 is then deposited on an area of additional thin layer 6. The assembly formed by substrate 1, the two superposed thin layers 6, 3 and metal layer 4 then undergoes heat treatment (arrow F2 in FIG. 15) in order to crystallize not only the material of thin layer 3 but also that of additional thin layer 6. Once the heat treatment has been completed, two superposed areas 5 and 7, both of which are crystallized for example in monocrystalline form, are then respectively obtained in thin layers 3 and 6 under metal layer 4.

According to a privileged development of the invention, it is advantageous to perform deposition of an additional oxide, for example a silicon oxide, with a thickness of a few nanometers, for example 5 nm. This additional oxide layer (not shown) is arranged under metal layer 4. The additional oxide layer enhances the solid crystallization phenomenon of the amorphous layer to be crystallized located just below.

It is thereby possible to crystallize a plurality of superposed thin layers made from different crystalline materials by a single heat treatment step. Such an embodiment is also called series mode crystallization and it can be used in particular for producing heterostructures. Crystallization can even include the metal layer. In addition, crystallization takes place under metal layer 4 and around the latter. Moreover, if metal layer 4 covers the whole of the free surface of additional thin layer 6, layers 3 and 6 can be totally crystallized.

Figure 18:
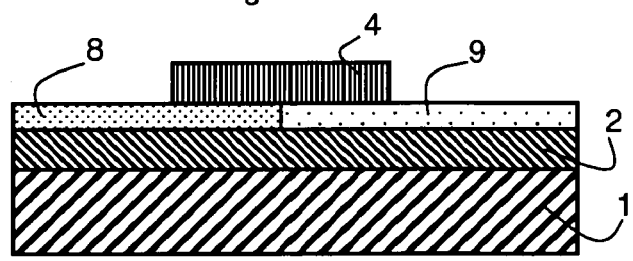
Figure 19:
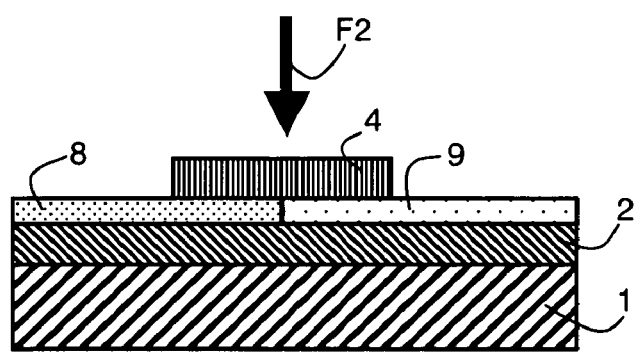
Figure 20:
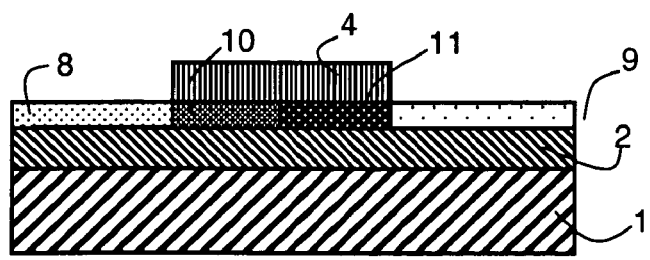

In an alternative embodiment represented in FIGS. 17 to 20, a plurality of thin layers can be deposited on a plurality of areas of the surface of top part 2 of substrate 1, before heat treatment. Thus, in FIG. 17, the surface of top part 2 is covered by two adjacent thin layers 8 and 9 respectively formed by different materials to be crystallized, for example in monocrystalline form. A metal layer 4 with a thickness comprised between 1 nm and 20 nm is then deposited on the stack so as to advantageously cover a part of thin layer 8 and a part of thin layer 9 (FIG. 18). The assembly formed by the substrate, the two adjacent thin layers 8 and 9 and metal layer 4 then undergoes heat treatment (arrow F2 in FIG. 19) so as to crystallize the respective materials of thin layers 8 and 9 arranged under metal layer 4 at the same time. Once the heat treatment has been completed, adjacent crystallized areas 10 and 11 corresponding to the respective areas of thin layers 8 and 9 arranged under metal layer 4 are then obtained in thin layers 8 and 9.

A plurality of adjacent thin layers can then be crystallized in a single heat treatment step. More particularly, the two thin layers 8 and 9 can be successively deposited on the surface of top part 2 of the substrate. Thin layer 8 can thus be previously deposited on an area of the surface of top part 2 of the substrate, through a mask hiding the area to be covered by second thin layer 8. Then the second thin layer is deposited on the free area of the substrate through a mask hiding already deposited thin layer 8. Such an alternative embodiment is also called parallel mode crystallization and is particularly suitable for associating the functional features of several materials on one and the same substrate.

A crystallization method according to the invention thus enables a material of nanometric thickness to be crystallized. Unlike the Czochralski method, crystalline thin layers of very small thickness can then be obtained, for example with a thickness of about a hundred nanometers, without any additional conditioning steps being required.

Such a method further enables crystalline thin layers of very large and advantageously monocrystalline surface to be obtained, with homogeneous properties over the whole of said surface.

Such a method is relatively inexpensive as it does not require a crucible and presents a relatively low thermal budget as the heat input required for crystallization does not have to reach the melting temperature of the material to be crystallized.

Finally, the crystallized thin layer can be in a different crystalline phase, with different physical properties from those synthesized by existing crystallization methods. Such a production method can be used in the field of nano-technological methods, but also in the energy field and more particularly in the field of photovoltaic cells.

For example purposes, a device for implementing the crystallization method can comprise:
- a $CO_2$ laser source emitting a continuous laser beam
- a laser beam power control and stability device
- a focusing lens to focus the laser beam on the substrate provided with a thin layer to be crystallized and with a metal layer previously deposited on said substrate
- and a device for moving said substrate or laser beam so as to be able to thermally treat the whole surface of the substrate.

The substrate is for example Corning glass for flat screen displays with a vitreous temperature of about 550° C. and a thickness of about 1 mm. The thin layer to be crystallized is for example made from amorphous silicon deposited by vacuum evaporation, the thickness of the thin layer being equal to 500 nm and the temperature of the substrate when evaporation takes place being equal to 400° C. A silica layer with a thickness of 5 nm is deposited by vacuum evaporation on the amorphous silicon layer. The metal layer formed by gold aggregates is then deposited on the silicon oxide layer. The metal layer has an equivalent thickness equal to 5 nm. All these depositions can be performed at the same substrate temperature in the same vacuum deposition equipment.

The continuous $CO_2$ laser beam enables heat treatment of the top layer of the substrate. The emission wavelength of said laser is about 10.59 μm, which corresponds to the most powerful emission ray of the laser. This excitation wavelength is suited to the absorption range of the top layer of the substrate, enabling a temperature increase of said top layer to be achieved. In glass, all the $CO_2$ laser beam emission rays (9.2-10.8 μm) can in fact be used. The power stability of the excitation source is standard, typically about ±3%, over the heat treatment period. In addition, any laser emission mode can be used (gaussian, flat, annular, etc.), but it must be stable. It is advantageously flat. Finally, the power required to perform the heat treatment is a linear power which depends on the characteristic dimensions of the laser beam and on the physical properties of the amorphous top layer of the substrate (absorption, thermal conductivity, etc), and on the scanning speed of said beam. For a gaussian laser beam with a diameter at 1/e of 300 μm, the incident laser power to achieve crystallization is typically 2 Watts, at the speed of 1 cm/s, in interaction with the implementation device described above.

The radiation of the $CO_2$ laser beam is therefore incident on the front face of the stack formed by the layer of metal aggregates, the very thin oxide layer, the thin layer to be crystallized and the substrate. It passes through the metal and the thin layer to be crystallized before being absorbed in the substrate and causing a rapid temperature increase of said substrate, with passage in the glass transition zone, which causes crystallization of the thin layer of silicon.

The laser power control and stability device preferably comprises several elements: a laser power adjuster which can be formed by a half-wave plate followed by a polarizer. Such a device enables the excitation power to be adjusted to a setpoint and thereby enables the power applied to the substrate to be thermally treated to be adjusted. This device can be completed by a shutter and by a laser power measurement device designed to check that the power setpoint is in fact reached. It can even include a device for real-time stabilization of the annealing laser power. The shutter could be replaced by an "on-off" switching device of the laser source itself.

The focusing lens is for example made of ZnSe and it can be treated to be anti-glare at the laser beam emission wavelength. Its focal distance can be adjusted to the required focal spot on the thin layer to be crystallized. The dimensions of the focal spot on the surface of the stack can further be determined by a method called knife method. The lens can also be cylindrical so as to produce a more extensive light beam in a direction perpendicular to the scanning direction. This enables a larger substrate surface to be covered per passage line.

The invention is not limited to the embodiments described above. The surface of top part 2 of substrate 1 is not necessarily flat. It can for example be spherical, concave or convex or it can comprise hollow areas and/or raised areas. Said surface can moreover be patterned when going to liquid or overmelted liquid state. This patterning can be induced by different mechanical, acoustic, laser or other methods.

Such a crystallization method can be applied to devices that require crystalline layers, such as electronic devices (diodes, transistors, . . . ), optical devices (mirrors, spherical optics parts, etc), photon devices (waveguides, etc), and so forth.

The crystallization method is in fact intrinsically favorable to crystallization of layers having a thickness ranging from a nanometer to several hundred nanometers. However, to crystallize a thicker layer or to obtain new crystalline phases, it may be advantageous to initially cool the stack formed by the substrate, the thin layer to be crystallized and the metal layer in order to facilitate heat transfer from the substrate through the amorphous layer that is to be crystallized through to the surface metal layer.

The invention claimed is:

1. A solid phase crystallization method, comprising the following successive steps:
   a) depositing a first layer of amorphous or polycrystalline material on a surface of a top part of a substrate,
   b) depositing a metal layer with a thickness in a range between 1 nm and 20 nm on the first layer, the top part of the substrate comprising, after step b), a second material in an amorphous state able to change to a liquid or an overmelted liquid state, and
   c) performing a thermal treatment to enable crystalline growth of the material of the first layer, simultaneously causing:
      a temperature increase of the top part of the substrate at a rate of more than 100K per second until the second material of the top part of the substrate goes to the liquid or the overmelted liquid state, and
      a heat transfer from an interface between the top part of the substrate and the first layer to an interface between the first layer and the metal layer.

2. The method according to claim 1, wherein step c) is performed by applying a continuous or pulsed laser beam presenting an emission wavelength range corresponding to an absorption wavelength range of the top part of the substrate and to a transparency wavelength range of the amorphous or polycrystalline material of the first layer to be crystallized.

3. The method according to claim 2, wherein an absorption coefficient of the top part of the substrate is three times higher than an absorption coefficient of the first layer to be crystallized in an emission wavelength range of the laser beam.

4. The method according to claim 2, wherein the laser beam is obtained from a CO2 or YAG laser source.

5. The method according to claim 1, further comprising, between steps b) and c): performing a cooling step of a stack comprising the substrate, the first layer and the metal layer.

6. The method according to claim 1, wherein the top part of the substrate is amorphous before step a).

7. The method according to claim 1, wherein the top part of the substrate is crystalline before step a), and the top part of the substrate is transformed into an amorphous material after step a) or after step b).

8. The method according to claim 1, wherein the top part of the substrate is formed by a material chosen from one of a group consisting of glasses, ceramics, non-crystalline polymers, metals and metal alloys.

9. The method according to claim 1, wherein the substrate is entirely made of amorphous material before step c).

10. The method according to claim 1, wherein step a) comprises successive deposition of a plurality of first layers on the surface of the top part of the substrate.

11. The method according to claim 1, wherein step a) comprises depositing a plurality of first layers on a plurality of areas of the surface of the top part of the substrate.

12. The method according to claim 1, wherein step b) comprises depositing a plurality of metal layers.

13. The method according to claim 1, wherein the metal layer is formed by aggregates of metal material.

* * * * *